(12) United States Patent
Kamijima (10) Patent No.: US 8,052,308 B2
(45) Date of Patent: Nov. 8, 2011

(54) LIGHT SOURCE HAVING WAVELENGTH CONVERTER AND WAVELENGTH SEPARATING MEMBER FOR REFLECTING CONVERTED LIGHT

(75) Inventor: Shunji Kamijima, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 350 days.

(21) Appl. No.: 12/060,349

(22) Filed: Apr. 1, 2008

(65) Prior Publication Data

US 2008/0259975 A1    Oct. 23, 2008

(30) Foreign Application Priority Data

Apr. 18, 2007   (JP) ................................ 2007-108979
Jan. 25, 2008   (JP) ................................ 2008-014563

(51) Int. Cl.
*F21V 9/06* (2006.01)
(52) U.S. Cl. .......... 362/293; 362/84; 362/259; 362/231; 359/328; 353/84
(58) Field of Classification Search .............. 362/259, 362/553, 230–231, 293, 84; 359/328; 353/84; 372/22–23
See application file for complete search history.

(56) References Cited

U.S. PATENT DOCUMENTS

| 5,265,115 | A | * | 11/1993 | Amano | 372/75 |
| 5,452,312 | A | * | 9/1995 | Yamamoto et al. | 372/5 |
| 6,882,665 | B2 | * | 4/2005 | Miura et al. | 372/22 |
| 7,021,811 | B2 | * | 4/2006 | Sylvester et al. | 362/583 |
| 7,230,762 | B1 | * | 6/2007 | Suganuma | 359/569 |
| 2006/0023173 | A1 | | 2/2006 | Mooradian et al. | |
| 2006/0023757 | A1 | | 2/2006 | Mooradian et al. | |
| 2006/0268241 | A1 | | 11/2006 | Watson et al. | |
| 2006/0280219 | A1 | | 12/2006 | Shchegrov | |
| 2007/0153862 | A1 | | 7/2007 | Shchegrov et al. | |
| 2007/0153866 | A1 | | 7/2007 | Shchegrov et al. | |

FOREIGN PATENT DOCUMENTS

| EP | 1 926 186 A1 | 5/2008 |
| JP | A 5-235441 | 9/1993 |
| JP | A-11-97778 | 4/1999 |
| JP | A-2000-343263 | 12/2000 |
| JP | A-2001-53358 | 2/2001 |
| JP | A-2001-95819 | 4/2001 |
| JP | A-2002-189236 | 7/2002 |
| JP | A-2007-43068 | 2/2007 |
| WO | WO 2007/032229 A1 | 3/2007 |

OTHER PUBLICATIONS

Aram Mooradian et al., "High Power Extended Vertical Cavity Surface Emitting Diode Lasers and Arrays and Their Applications," Micro-Optics Conference, Tokyo, pp. 1-4, Nov. 2, 2005.

* cited by examiner

*Primary Examiner* — Ismael Negron
(74) *Attorney, Agent, or Firm* — Oliff & Berridge, PLC (57) ABSTRACT

A light source includes a light source unit which supplies first wavelength light, a wavelength converting unit which converts the first wavelength light into second wavelength light different from the first wavelength light, and a leakage preventing unit which prevents leakage of the first wavelength light out of the light source. The area where the light source unit and the wavelength converting unit are disposed is optically separated from the area where the leakage preventing unit is disposed.

14 Claims, 6 Drawing Sheets

LIGHT SOURCE HAVING WAVELENGTH CONVERTER AND WAVELENGTH SEPARATING MEMBER FOR REFLECTING CONVERTED LIGHT

BACKGROUND

1. Technical Field

The present invention relates to a light source, a lighting device, a monitoring device, and a projector.

2. Related Art

Currently, a light source which uses laser beam source and supplies fundamental laser beam after converting its wavelength is known. This light source uses second-harmonic generation (SHG) element as a wavelength conversion element for converting wavelength of fundamental laser beam, for example. By the function of the SHG element, laser beam having desired wavelength can be supplied from a general-purpose laser beam source. Moreover, a structure which supplies a sufficient amount of laser beam can be provided by using the SHG element. As an example of the light source including the SHG element, JP-A-5-235441 discloses a light source which contains the SHG element within a resonator structure for resonating laser beam. In the resonator structure, fundamental laser beam is resonated to convert its wavelength into a desired wavelength, and the laser beam having the desired wavelength is extracted and supplied with high wavelength conversion efficiency.

According to the light source having the structure disclosed in JP-A-5-235441, a mirror having wavelength selectivity is provided within the resonator structure to reflect fundamental laser beam. However, even when the mirror having wavelength selectivity is provided, it is difficult to reflect all of the fundamental laser beam. Thus, there is a possibility that a part of the fundamental laser beam passes through the mirror and leaks out of the light source. For example, when an image display apparatus includes this light source and uses infrared light as the fundamental laser beam, the infrared light having great light energy has adverse effect on peripheral equipment such as a screen on which images are displayed. In case of a system which returns the infrared light toward the light source contained in an LD light source package, the infrared light has adverse effect on a temperature controller of the SHG element. In this case, appropriate temperature control is difficult. When a light output monitor is equipped, monitoring cannot be achieved in a normal condition due to the effect of the returned infrared light.

SUMMARY

It is an advantage of some aspects of the invention to provide a light source which converts wavelength of fundamental laser beam before supplying the laser beam. This light source prevents leakage of the fundamental laser beam having adverse effect on peripheral equipment out of the light source, and stabilizes temperature control within an LD light source package and light source output. It is another advantage of some aspects of the invention to provide a lighting device, a monitoring device, and a projector including the light source.

A light source according to a first aspect of the invention includes a light source unit which supplies first wavelength light, a wavelength converting unit which converts the first wavelength light into second wavelength light different from the first wavelength light, and a leakage preventing unit which prevents leakage of the first wavelength light out of the light source. The area where the light source unit and the wavelength converting unit are disposed is optically separated from the area where the leakage preventing unit is disposed. The description "the area where the light source unit and the wavelength converting unit are disposed is optically separated from the area where the leakage preventing unit is disposed" herein refers to the condition where specular reflection light of the first wavelength light produced by an optical element contained in the leakage preventing unit does not directly return to the area where the light source unit and the wavelength converting unit are disposed.

According to this structure, the light source unit supplies the first wavelength light, and the wavelength converting unit converts the first wavelength light into the second wavelength light. The leakage preventing unit prevents leakage of the first wavelength light to the outside. Since the area of the light source unit and the wavelength converting unit is optically separated from the area of the leakage preventing unit, returning of the first wavelength light having entered the leakage preventing unit to the area of the light source unit and the wavelength converting unit can be easily prevented. Thus, leakage of infrared light as the first wavelength light having adverse effect on the peripheral equipment from the light source to the outside is avoided. Accordingly, the problem caused by infrared light leakage can be prevented, and stabilization of temperature control within the LD light source package and the light source output can be achieved.

It is preferable that the leakage preventing unit has a wavelength separating member which reflects the second wavelength light and transmits the first wavelength light, and a light absorbing member which absorbs the first wavelength light having passed through the wavelength separating member.

According to this structure, in the leakage preventing unit, the wavelength separating member reflects the second wavelength light and transmits the first wavelength light. The light absorbing member absorbs the transmitted first wavelength light. When the first wavelength light is infrared light, the infrared light passes through the wavelength separating member to be absorbed by the light absorbing member. Thus, when the first wavelength light is infrared light, the infrared light does not return to the area of the light source unit and the wavelength converting unit. As a result, leakage of the infrared light having adverse effect on the peripheral equipment from the light source to the outside is avoided. Accordingly, stabilization of temperature control within the LD light source package and the light source output is achieved.

It is preferable that the light absorbing member has a light diffusing section for diffusing the first wavelength light having passed through the wavelength separating member.

According to this structure, the light diffusing section of the light absorbing member diffuses the first wavelength light. Thus, when the first wavelength light is infrared light, the infrared light does not return to the area of the light source unit and the wavelength converting unit. Accordingly, the adverse effect of the infrared light on the peripheral equipment can be reduced by decreasing the light energy of the infrared light, and stabilization of temperature control within the LD light source package and the light source output can be achieved.

It is preferable that the surface of the light diffusing section through which the first wavelength light enters is inclined to the optical axis of the entering first wavelength light.

According to this structure, the light diffusing section inclines the entering first wavelength light in a direction different from the entering direction by diffusion. Thus, when the first wavelength light is infrared light, the infrared light does not return to the area of the light source unit and the wavelength converting unit. Accordingly, stabilization of temperature control within the LD light source package and the light source output can be achieved.

It is preferable that the light absorbing member has a tapered surface whose diameter decreases toward the wavelength separating member, and a light blocking section which blocks the first wavelength light reflected by the tapered surface such that the first wavelength light does not enter the wavelength separating member.

According to this structure, the light absorbing member reflects and absorbs the entering first wavelength light by the tapered surface and the light blocking section such that the first wavelength light does not return to the wavelength separating member. Thus, when the first wavelength light is infrared light, the infrared light does not return to the area of the light source unit and the wavelength converting unit. Accordingly, stabilization of temperature control within the LD light source package and the light source output can be achieved.

It is preferable that the light absorbing member has a tapered surface whose diameter increases toward the wavelength separating member.

According to this structure, the light absorbing member reflects and absorbs the entering first wavelength light by the tapered surface of the light absorbing member such that the first wavelength light does not return to the wavelength separating member. Thus, when the first wavelength light is infrared light, returning of the infrared light to the area of the light source unit and the wavelength converting unit can be prevented. Accordingly, stabilization of temperature control within the LD light source package and the light source output can be achieved.

It is preferable that the light absorbing member has a radiating section.

According to this structure, heat generated within the light source device by the first wavelength light having passed through the wavelength separating member can be cooled by the radiating section of the light absorbing member.

It is preferable that the light absorbing member has a cooling section.

According to this structure, heat generated within the light source device by the first wavelength light having passed through the wavelength separating member can be cooled by the cooling section of the light absorbing member.

It is preferable that the leakage preventing unit has a wavelength separating member which transmits the second wavelength light and reflects the first wavelength light, and a light absorbing member which absorbs the first wavelength light reflected by the wavelength separating member. In this case, it is preferable that the light absorbing member has a light blocking section which blocks the reflected first wavelength light such that the first wavelength light does not enter the area where the wavelength converting unit is disposed.

According to this structure, the wavelength separating member of the leakage preventing unit transmits the second wavelength light and reflects the first wavelength light. The light absorbing member prevents entrance of the reflected first wavelength light into the area of the wavelength converting unit by using the light blocking section. When the first wavelength light is infrared light, the infrared light is reflected by the wavelength separating member to be absorbed without returning to the area of the wavelength converting unit. Thus, leakage of the infrared light having adverse effect on the peripheral equipment from the light source to the outside can be prevented.

It is preferable that the light absorbing member has a light detecting section which detects the quantity of the reflected first wavelength light. In this case, it is preferable that the light blocking section blocks the first wavelength light which contains light reflected by the light detecting section such that the first wavelength light does not enter the area where the wavelength converting unit is disposed.

According to this structure, the light detecting section for detecting the light quantity is provide on the light absorbing member, and the light blocking section blocks light containing the first wavelength light reflected by the light detecting section such that the light does not enter the area of the wavelength converting unit. Thus, leakage of the infrared light as the first wavelength light having adverse effect on the peripheral equipment from the light source to the outside can be prevented in the structure having the light detecting section, and stabilization of temperature control within the LD light source package and the light source output can be achieved.

It is preferable that the first wavelength light released from the wavelength converting unit and reflected by the leakage preventing unit does not directly enter the area where the wavelength converting unit is disposed.

According to this structure, the first wavelength light released from the wavelength converting unit and reflected by the leakage preventing unit does not directly enter the area of the wavelength converting unit. Thus, leakage of infrared light as the first wavelength light having adverse effect on the peripheral equipment from the light source to the outside is avoided. Accordingly, the problem caused by infrared light leakage can be prevented, and stabilization of temperature control within the LD light source package and the light source output can be achieved.

It is preferable that the light source further includes a housing which covers the light source unit, the wavelength converting unit, and the leakage preventing unit, and has an opening through which the second wavelength light is emitted, and a window provided on the opening. In this case, it is preferable that the leakage preventing unit is disposed such that the first wavelength light released from the leakage preventing unit and reflected by the window does not directly enter the area where the wavelength converting unit is disposed.

According to this structure, the first wavelength light released from the leakage preventing unit and reflected by the window does not directly enter the area of the wavelength converting unit. Thus, leakage of infrared light as the first wavelength light having adverse effect on the peripheral equipment from the light source to the outside is avoided. Accordingly, the problem caused by infrared light leakage can be prevented, and stabilization of temperature control within the LD light source package and the light source output can be achieved.

A lighting device according to a second aspect of the invention includes the light source described above.

According to the lighting device of the second aspect of the invention, leakage of infrared light as the first wavelength light having adverse effect on the peripheral equipment from the lighting device to the outside is avoided. Accordingly, the problem caused by infrared light leakage can be prevented, and stabilization of temperature control within the LD light source package and the light source output can be achieved.

A monitoring device according to a third aspect of the invention includes the light source described above, and an image pickup unit which picks up an image of a subject receiving light from the light source.

According to the monitoring device of the third aspect of the invention, leakage of infrared light as the first wavelength light having adverse effect on the peripheral equipment from the monitoring device to the outside is avoided. Accordingly, the problem caused by infrared light leakage can be prevented, and stabilization of temperature control within the LD light source package and the light source output can be achieved.

A projector according to a fourth aspect of the invention includes the light source described above, and an image forming device which displays an image having a desired size on a display surface by using light emitted from the light source.

According to the projector of the fourth aspect of the invention, leakage of infrared light as the first wavelength light having adverse effect on the peripheral equipment from the projector to the outside is avoided. Accordingly, the problem caused by infrared light leakage can be prevented, and stabilization of temperature control within the LD light source package and the light source output can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A light source according to a first embodiment of the invention is now described with reference to the drawings.

Figure 1:
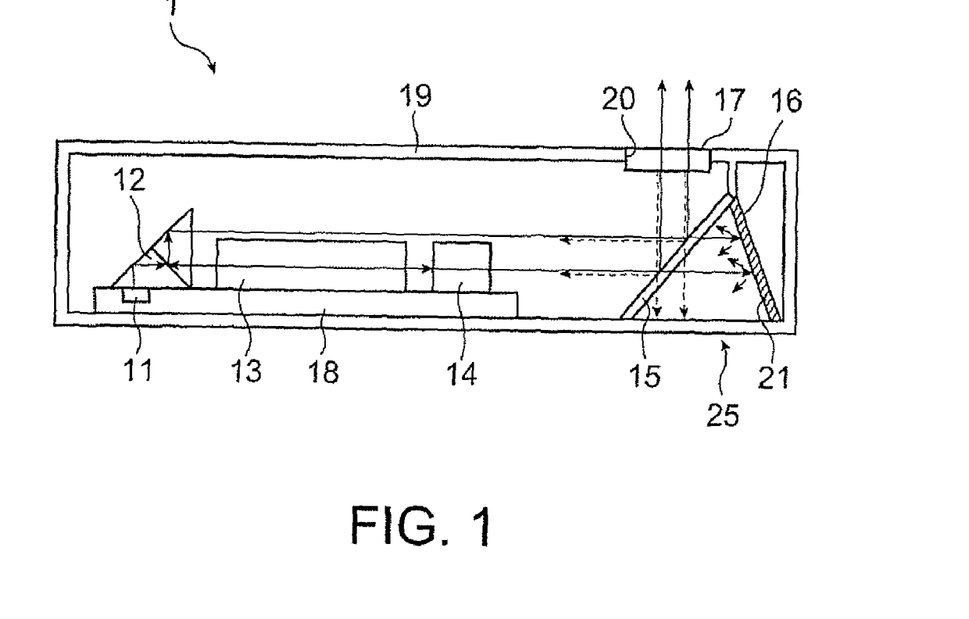
FIG. 1 illustrates a general structure of a light source according to a first embodiment of the invention.

FIG. 1 illustrates a general structure of a light source according to the first embodiment of the invention. As illustrated in the figure, a light source 1 includes a laser beam source 11, an optical path changing prism 12, an SHG element 13, an external resonator 14, a wavelength selection mirror 15, an IR absorber 16, and an IR absorbing window 17.

The laser beam source 11 supplies fundamental laser beam constituted by one or a plurality of infrared lights as a light source unit. The laser beam source 11 has a light emission element which emits infrared light substantially in the vertical direction with respect to the light emission surface of the light emission element. Infrared light emitted from the laser beam source 11 enters the optical path changing prism 12. The laser beam source 11 is a semiconductor laser or a solid laser, for example.

According to this embodiment, infrared light is first wavelength light having wavelength longer than about 830 nm. Visible light is second wavelength light having wavelength in the range from about 360 nm to about 830 nm. Thus, infrared light is included in the range of non-visible light out of the range of visible light.

The optical path changing prism 12 optically refracts or reflects entering laser beam. Infrared light emitted from the laser beam source 11 is reflected by the optical path changing prism 12 such that the optical path of the infrared light is bended approximately at 90 degrees, and then enters the SHG element 13. The optical path changing prism 12 is a component having a metal reflection film such as aluminum on a base such as glass, or a total reflection prism, for example.

The SHG element 13 is a wavelength conversion element which converts wavelength of laser beam into approximately half of the original wavelength as a wavelength converting unit. The infrared light emitted from the laser beam source 11 via the optical path changing prism 12 is converted into visible light while passing through the SHG element 13. The conversion efficiency of the SHG element 13 in this conversion is approximately 40% to 50%. Thus, the laser beam released from the SHG element 13 and entering the external resonator 14 includes both infrared light and visible light. The SHG element 13 is non-linear optical crystal, for example, The external resonator 14 is a mirror having wavelength selectivity. The external resonator 14 reflects the infrared light contained in the entering laser beam toward the SHG element 13, and transmits the visible light of the laser beam. The reflected laser beam is repeatedly reflected on the optical path between the external resonator 14 and the laser beam source 11 to be amplified. The visible light of the amplified laser beam having wavelength converted by the SHG element 13 is released from the external resonator 14. However, the external resonator 14 does not reflect all the laser beam having predetermined wavelength (infrared light), but transmits a part (about 1% to 2%) of the laser beam, Thus, the laser beam released from the external resonator 14 contains infrared light as well as visible light. The laser beam released from the external resonator 14 enters the wavelength selection mirror 15. The external resonator 14 is an optical element such as hologram having periodic grating, for example.

The visible light of the laser beam having been reflected by the external resonator 14 and passed through the SHG element 13 toward the optical path changing prism 12 is refracted by the optical path changing prism 12 to enter the wavelength selection mirror 15. At this time, the visible light does not pass the components of the SHG element 13 and the external resonator 14 but directly enters the wavelength selection mirror 15.

The wavelength selection mirror 15 reflects laser beam having predetermined wavelength of entering laser beam and transmits laser beam having other wavelength as a wavelength separating member. In this embodiment, the wavelength selection mirror 15 reflects visible light contained in laser beam and transmits infrared light of the laser beam. The wavelength selection mirror 15 is inclined approximately at 45 degrees to a plane perpendicular to the light entering from the external resonator 14 in the traveling direction of the entering light. Thus, the visible light reflected by the wavelength selection mirror 15 changes its optical path through approximately 90 degrees, and enters the IR absorbing window 17. Also, the infrared light having passed through the wavelength selection mirror 15 enters the IR absorber 16 without directional change. The wavelength selection mirror 15 is a parallel flat plate made of glass or the like having wavelength selection layer such as dielectric multilayer film on the entrance surface of the flat plate, for example.

The IR absorber 16 absorbs entering infrared light as a component of a light absorbing member 25. The IR absorber 16 has a diffusing surface 21 as a light diffusing section for diffusing laser beam so as to diffuse infrared light not absorbed. The IR absorber 16 is inclined approximately at 30 degrees to the plane perpendicular to the light entering from the wavelength selection mirror 15 in the direction opposite to the traveling direction of the entering light. Thus, infrared light is diffused slightly downward by the diffusing surface 21. The IR absorber 16 is made of infrared light absorbing material like metal such as anodized black aluminum plate, molded magnesium die casting structure, and titanium frame, for example. The diffusing surface 21 is a rough surface of the material formed by etching or machining, for example.

The wavelength selection mirror 15 and the IR absorber 16 are included in the structure of the leakage preventing unit for preventing leakage of infrared light out of the light source 1. As illustrated in FIG. 1, the area where the wavelength selection mirror 15 and the IR absorber 16 are disposed is different from the area where the laser light source 11, the optical path changing prism 12, the SHG element 13, and the external resonator 14 (hereinafter referred to as laser light source 11 through external resonator 14) are disposed. Thus, arrangement is determined such that the specular reflection light of infrared light reflected by the wavelength selection mirror 15 and the IR absorber 16 does not directly return to the area where the laser light source 11 through the external resonator 14 are disposed. In this arrangement, these two areas are optically separated.

The IR absorbing window 17 absorbs infrared light to reduce transmission of infrared light. Visible light entering the IR absorbing window 17 transmits the IR absorbing window 17 to be released out of the light source 1. The IR absorbing window 17 is provided in such a condition as to completely close an opening 20 formed on a housing 19. There is a possibility that the light reflected by the wavelength selection mirror 15 and entering the IR absorbing window 17 contains a part of infrared light. In this case, the IR absorbing window 17 absorbs the contained infrared light, and reflects the infrared light not absorbed toward the wavelength selection mirror 15. The infrared light reflected by the IR absorbing window 17 (indicated by broken arrows) passes through the wavelength selection mirror 15. At this time, a part of the infrared light changes its optical path approximately through 90 degrees by the function of the wavelength selection mirror 15 and returns to the external resonator 14 with considerably decreased light energy. The IR absorbing window 17 is a glass flat plate containing $SiO_2$ and coated with IR cut film, or IR absorbing glass for absorbing infrared light, for example.

The laser light source 11 through the external resonator 14 are disposed on a base plate 18. The base plate 18 has a flat attachment surface. The base plate 18 is made of heat conductive material capable of conducting heat, for example. The housing 19, made of material which does not transmit infrared light, for example, is provided in such a condition as to cover optical elements disposed within the light source 1.

According to the light source 1 in this embodiment, laser beam entering the wavelength selection mirror 15 contains infrared light as well as visible light as discussed above. The wavelength selection mirror 15 reflects visible light in the emission direction out of the light source 1 and transmits infrared light for wavelength separation in the entered laser beam. The infrared light having passed through the wavelength selection mirror 15 is absorbed by the IR absorber 16. The infrared light not absorbed at this time is diffused by the diffusing surface 21 of the IR absorber 16 so that light energy of the infrared light can be decreased. Since the area of the laser light source 11 through the external resonator 14 is optically separated from the area of the wavelength selection mirror 15 and the IR absorber 16, the infrared light having passed through the wavelength selection mirror 15 does not return to the area of the laser light source 11 through the external resonator 14. Accordingly, leakage of infrared light having adverse effect on the peripheral equipment out of the light source 1 is prevented.

The IR absorber 16 is inclined approximately at 30 degrees in the direction opposite to the traveling direction of the entering light, and the infrared light is diffused slightly downward by the diffusing surface 21. In this case, returning of the diffused infrared light to the area of the laser light source 11 through the external resonator 14 is further prevented, and thus stabilization of temperature control within the LD light source package and light source output can be achieved. Moreover, transmission of infrared light to the outside through the IR absorbing window 17 can be further prevented.

Second Embodiment

A light source according to a second embodiment of the invention is now described with reference to the drawings.

Figure 2:
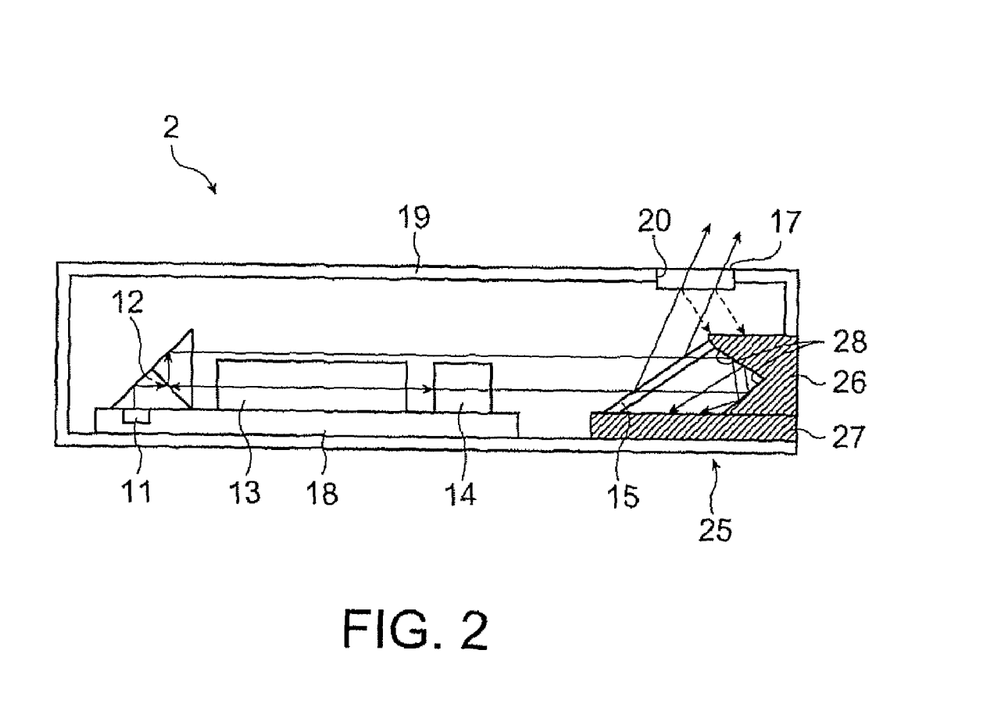
FIG. 2 illustrates a general structure of a light source according to a second embodiment of the invention.

FIG. 2 illustrates a general structure of the light source according to the second embodiment of the invention. As illustrated in the figure, a light source 2 includes the laser light source 11 through the external resonator 14, the wavelength selection mirror 15, and the IR absorbing window 17 similarly to the light source 1 in the first embodiment. The light source 2 has IR absorbers 26 and 27 having shapes different from that of the IR absorber 16 in the first embodiment on the emission side of light passing the wavelength selection mirror 15. The laser light source 11 through the external resonator 14 and the IR absorbing window 17 have functions and structures similar to those in the light source 1 of the first embodiment, and the same explanation is not repeated.

The wavelength selection mirror 15 and the IR absorbers 26 and 27 are disposed in the traveling direction of light released from the external resonator 14, and included in the structure of the leakage preventing unit. The wavelength selection mirror 15 has a function similar to that of the wavelength selection mirror 15 in the first embodiment, but is inclined at approximately 50 degrees, which is an angle different from the angle in the first embodiment, with respect to the plane perpendicular to the light entering from the external resonator 14. Thus, the angle of the light reflected by the wavelength selection mirror 15 changes, and the positions of the opening 20 and the IR absorbing window 17 on the housing 19 are slightly shifted in the light emission direction from the external resonator 14 from the corresponding positions in the first embodiment. As a result, difference between the emission direction of visible light and reflection direction of infrared light reflected by the IR absorber 26 increases, and thus leakage of infrared light to the outside can be more easily prevented. The inclination angle of the wavelength selection mirror 15 is determined such that the infrared light reflected by the IR absorber 26 does not pass through the wavelength selection mirror 15 but is reflected by the wavelength selection mirror 15 when the infrared light reaches the mirror 15.

The IR absorbers 26 and 27 absorb entering infrared light as components of the light absorbing member 25. The IR absorber 26 of the pair of the IR absorbers 26 and 27 has a tapered surface 28 whose diameter increases toward the wavelength selection mirror 15. The tapered surface 28 reflects infrared light not absorbed by the IR absorber 26. The angle of the tapered surface 28 is determined such that the infrared light reflected by the tapered surface 28 does not return to the wavelength selection mirror 15 with large light energy maintained. Thus, infrared light can be absorbed by both absorption and multi-reflection. The IR absorbers 26 and 27 are made of metal or ABS resin for absorbing infrared light, for example.

The position of the IR absorbing window 17 is slightly shifted in the emission direction of light released from the external resonator 14 from the corresponding position in the first embodiment. Thus, the infrared light reflected by the IR absorbing window 17 (indicated by broken arrows) enters the IR absorber 26. The infrared light having entered the IR absorber 26 is absorbed by the IR absorber 26. Accordingly, the infrared light does not return toward the external resonator 14.

According to the light source 2 in this embodiment, infrared light having passed through the wavelength selection mirror 15 enters the IR absorber 26 to be absorbed as discussed above. The infrared light not absorbed at this time is reflected by the tapered surface 28 of the IR absorber 26, and then absorbed by the IR absorbers 26 and 27. Accordingly, leakage of infrared light having adverse effect on the peripheral equipment out of the light source 2 can be prevented, and stabilization of temperature control within the LD light source package and the light source output can be achieved.

Third Embodiment

A light source according to a third embodiment of the invention is now described with reference to the drawings.

Figure 3:
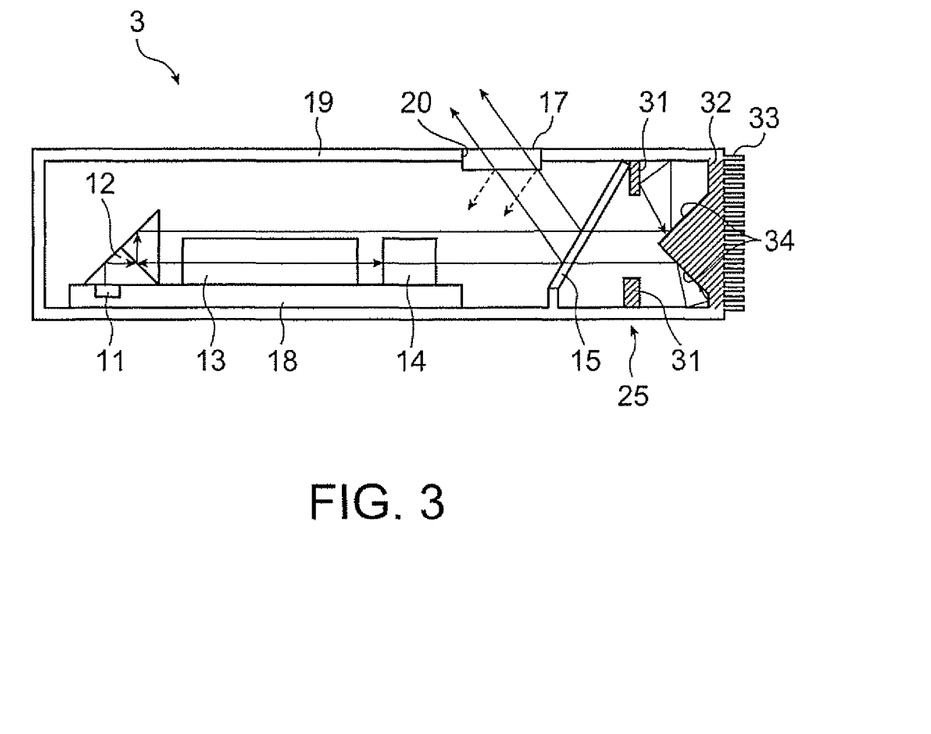
FIG. 3 illustrates a general structure of a light source according to a third embodiment of the invention.

FIG. 3 illustrates the light source according to the third embodiment of the invention. As illustrated in the figure, a light source 3 includes the laser light source 11 through the external resonator 14, the wavelength selection mirror 15, and the IR absorbing window 17 similarly to the light source 1 in the first embodiment. The light source 3 has an aperture 31 and a heat sink 32 on the emission side of light having passed through the wavelength selection mirror 15 instead of the corresponding part of the light source 1 in the first embodiment. The laser light source 11 through the external resonator 14 and the IR absorbing window 17 have functions and structures similar to those in the light source 1 of the first embodiment, and the same explanation is not repeated.

The wavelength selection mirror 15, the aperture 31, and the heat sink 32 are disposed in the traveling direction of light released from the external resonator 14 and included in the structure of the leakage preventing unit. The wavelength selection mirror 15 has a function similar to that of the wavelength selection mirror 15 in the first embodiment, but is inclined at approximately 40 degrees, which is an angle different from the angle in the first embodiment, with respect to the plane perpendicular to the light entering from the external resonator 14. Thus, the angle of the light reflected by the wavelength selection mirror 15 changes, and the positions of the opening 20 and the IR absorbing window 17 on the housing 19 are slightly shifted from those positions in the first embodiment toward the external resonator 14. As a result, difference between the direction of visible light reflected by the wavelength selection mirror 15 and the direction of infrared light passing through the wavelength selection mirror 15 increases, and thus leakage of infrared light to the outside can be more easily prevented. Moreoverr the IR absorbing window 17 has a wider range of light transmission, which increases the quantity of absorbed infrared light.

The aperture 31 as a blocking section blocks infrared light having passed through the wavelength selection mirror 15 and entered the heat sink 32 such that the infrared light does not again return to the wavelength selection mirror 15 by reflection. In addition, the aperture 31 absorbs entering infrared light after reflection. The aperture 31 is formed integrally with the housing 19 and disposed in the vertical direction (as viewed in FIG. 3) with respect to the optical path of infrared light passing through the wavelength selection mirror 15. The aperture 31 is made of material for absorbing infrared light, for example.

The heat sink 32 has radiation fins 33 projecting to the right of the housing 19 (as viewed in FIG. 3) as a radiating section. The radiation fins 33 achieve cooling by radiating heat generated within the light source 3 by the infrared light having passed through the wavelength selection mirror 15. The heat sink 32 has another function of absorbing received infrared light. The heat sink 32 has a tapered surface 34 whose diameter decreases toward the wavelength selection mirror 15. The tapered surface 34 reflects infrared light not absorbed by the heat sink 32. The taper angle of the tapered surface 34 and the aperture 31 are determined such that the infrared light reflected by the tapered surface 34 does not return to the wavelength selection mirror 15. The heat sink 32 and the aperture 31 are included in the structure of the light absorbing member 25. The heat sink 32 is made of heat conductive material such as metal, for example. The tapered surface 34 is made of metal material or resin material for absorbing infrared light, for example.

Since the position of the IR absorbing window 17 is slightly shifted toward the external resonator 14 from the corresponding position in the first embodiment, the infrared light reflected by the IR absorbing window 17 (indicated by broken arrows) returns toward the external resonator 14. However, the light energy of the infrared light at this time is considerably decreased. It is possible to provide a light blocking section which prevents returning of the infrared light reflected by the IR absorbing window 17 toward the external resonator 14. In this embodiment, the specular reflection light released from the laser light source 11 through the external resonator 14 and reflected by the wavelength selection mirror 15 and the IR absorber 16 does not directly return toward the external resonator 14 similarly to the first embodiment.

According to the light source 3 in this embodiment, infrared light having passed through the wavelength selection mirror 15 enters the tapered surface 34 of the heat sink 32 to be absorbed as discussed above. The infrared light not absorbed in this step is repeatedly reflected by the inner wall of the housing 19, the aperture 31, and the tapered surface 34, to be finally absorbed. Thus, leakage of infrared light having adverse effect on the peripheral equipment out of the light source 3 can be prevented, and stabilization of temperature control within the LD light source package and the light source output can be achieved. Moreover, heat generated within the light source 3 by infrared light can be efficiently cooled by the radiation fins 33 on the heat sink 32.

Fourth Embodiment

A light source according to a fourth embodiment of the invention is now described with reference to the drawings.

Figure 4:
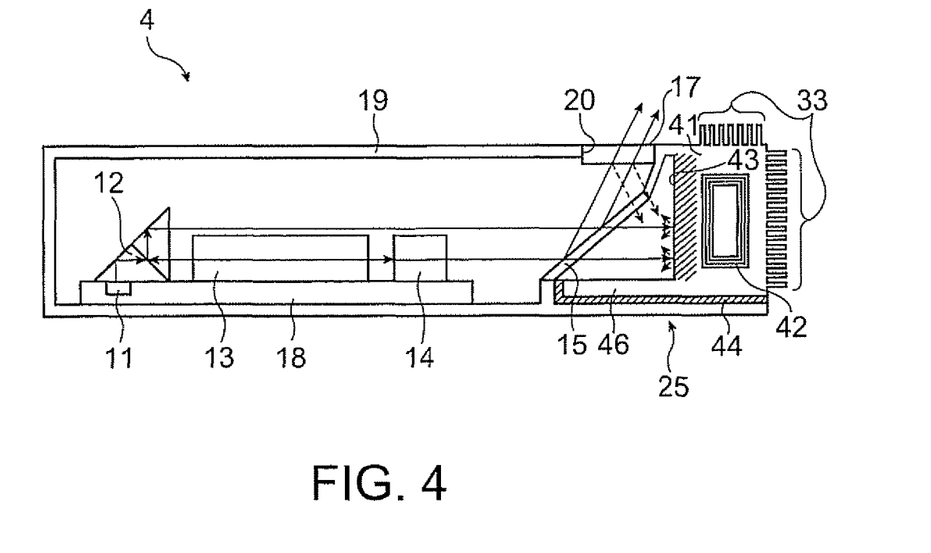
FIG. 4 illustrates a general structure of a light source according to a fourth embodiment of the invention.

FIG. 4 illustrates the light source according to the fourth embodiment of the invention. As illustrated in the figure, a light source 4 includes the laser light source 11 through the external resonator 14, the wavelength selection mirror 15, and the IR absorbing window 17 similarly to the light source 1 in the first embodiment. The light source 4 has only a heat sink 41 on the exit side of light having passed through the wavelength selection mirror 15 instead of the corresponding part of the light source I in the first embodiment. The laser light source 11 through the external resonator 14 and the IR absorbing window 17 have functions and structures similar to those in the light source 1 of the first embodiment, and the same explanation is not repeated.

The wavelength selection mirror 15 and the heat sink 41 are disposed in the traveling direction of light released from the external resonator 14, and included in the structure of the leakage preventing unit. The wavelength selection mirror 15 is inclined approximately at 50 degrees to the plane perpendicular to the entering light from the external resonator 14 similarly to the second embodiment. Thus, the position of the IR absorbing window 17 is slightly shifted in the emission direction of light released from the external resonator 14 from the corresponding position in the first embodiment.

The heat sink 41 has two pairs of the radiation fins 33 projecting to the right and to above from the housing 19 (as viewed in FIG. 4). A liquid flow path 42 as a cooling section is provided within the heat sink 41. A heat insulation structure 44 is further provided on a base 46 for supporting the heat sink 41. Heat generated within the heat sink 41 or the like by infrared light having passed through the wavelength selection mirror 15 is cooled by radiation via the radiation fins 33, and is further cooled by cooling liquid flowing through the liquid flow path 42. The heat insulation structure 44 insulates heat generated within the heat sink 41 or the like such that the heat is not conducted from the housing 19 to the entire structure of the light source 4.

The heat sink 41 has a function of absorbing received infrared light as well. The heat sink 41 is included in the structure of the light absorbing member 25. The heat sink 41 has a diffusing surface 43 as a light diffusing section for diffusing laser beam, and diffuses infrared light not absorbed. It is possible to slightly incline the diffusing surface 43 in the direction opposite to the traveling direction of entering light similarly to the IR absorber 16 in the first embodiment. The heat sink 41 is made of heat conductive material such as metal. The diffusing surface 43 is made of material for absorbing infrared light, for example, and formed by etching or by other method. The heat insulation structure 44 of the base 46 is made of resin material, or formed by a hollow structure or vacuum structure, for example.

Since the position of the IR absorbing window 17 is slightly shifted in the emission direction of the light released from the external resonator 14 from the corresponding position in the first embodiment, the infrared light reflected by the IR absorbing window 17 (indicated by broken arrows) enters the wavelength selection mirror 15. The infrared light having entered the mirror 15 is absorbed by the heat sink 41. Thus, the infrared light does not return toward the external resonator 14.

According to the light source 4 in this embodiment, infrared light having passed through the wavelength selection mirror 15 enters the diffusing surface 43 of the heat sink 41 to be absorbed as discussed above. Infrared light not absorbed in this step is diffused by the diffusing surface 43, and the light energy of the infrared light is thus decreased. Accordingly, leakage of infrared light having adverse effect on the peripheral equipment out of the light source 4 can be prevented, and stabilization of temperature control within the LD light source package and the light source output can be achieved. Moreover, heat generated within the light source 4 by infrared light can be more efficiently cooled by the two pairs of the radiation fins 33, the liquid flow path 42, and the like provided on the heat sink 41.

Fifth Embodiment

A light source according to a fifth embodiment of the invention is now described with reference to the drawings.

Figure 5:
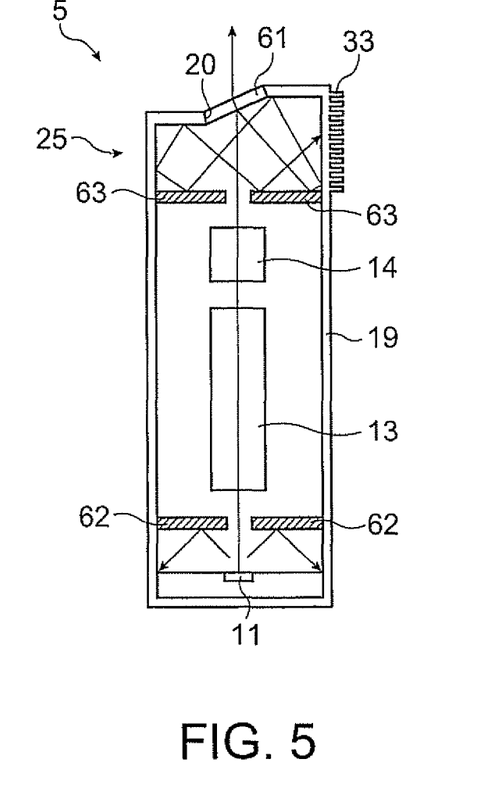
FIG. 5 illustrates a general structure of a light source according to a fifth embodiment of the invention.

FIG. 5 illustrates a general structure of the light source according to the fifth embodiment of the invention. As illustrated in the figure, the light source 5 includes the laser beam source 11, the SHG element 13, the external resonator 14, a wavelength selection mirror 61, an aperture 62 formed between the laser beam source 11 and the SHG element 13, and an aperture 63 formed between the external resonator 14 and the wavelength selection mirror 61. The radiation fins 33 projecting to the right (as viewed in FIG. 5) from the housing 19 are provided between the aperture 63 and the wavelength selection mirror 61. The laser light source 11, the SHG element 13, and the external resonator 14 have functions and structures similar to those in the light source 1 of the first embodiment, and the same explanation is not repeated.

Infrared light emitted from the laser beam source 11 is not reflected as in the light source 1 in the first embodiment, but directly enters the SHG element 13. Then, a part of the infrared light is converted into visible light by the SHG element 13. The laser beam having passed through the SHG element 13 is repeatedly reflected on the optical path between the external resonator 14 and the laser beam source 11 to be amplified, and is released from the external resonator 14. The laser beam released from the external resonator 14 in this step contains infrared light as well as visible light. The laser beam from the external resonator 14 enters the wavelength selection mirror 61. It is possible to use the structure of the laser beam source 11 through the external resonator 14 employed in the light source 1 in the first embodiment instead of the structure of the laser beam source 11, the SHG element 13, and the external resonator 14 employed in this embodiment.

The aperture 63 and the wavelength selection mirror 61 are disposed above the external resonator 14 (as viewed in FIG. 5), and included in the structure of the leakage preventing unit. The wavelength selection mirror 61 as a wavelength separating member transmits visible light of the entering laser beam and reflects infrared light of the laser beam unlike the wavelength selection mirror in the first embodiment. Each of the apertures 62 and 63 is formed integrally with the housing 19 on the left and right of the optical path of the laser beam (as viewed in FIG. 5). The aperture 62 absorbs and reflects radially extending infrared light of the infrared light emitted from the laser beam source 11 to prevent diffusion of infrared light toward the area above the aperture 62 (as viewed in FIG. 5) within the housing 19. The aperture 63 absorbs and reflects in multiple the infrared light reflected by the wavelength selection mirror 61 to block the infrared light such that the infrared light does not return to the area below the aperture 63 (as viewed in FIG. 5) within the housing 19. The aperture 63 as a blocking section is included in the structure of the light absorbing member 25. The apertures 62 and 63 are made of material for absorbing infrared light, for example.

According to the light source 5 in this embodiment, laser beam entering the wavelength selection mirror 61 contains infrared light as well as visible light as discussed above. The wavelength selection mirror 61 achieves wavelength separation of the entering laser beam by transmitting visible light out of the light source 5 and reflecting infrared light. The infrared light reflected by the wavelength selection mirror 61 is absorbed by the aperture 63. The infrared light not absorbed at this time is repeatedly reflected by the inner wall of the housing 19, the aperture 63, and the wavelength selection mirror 61 to be absorbed. Thus, leakage of infrared light having adverse effect on the peripheral equipment out of the light source 5 can be prevented.

Figure 6:
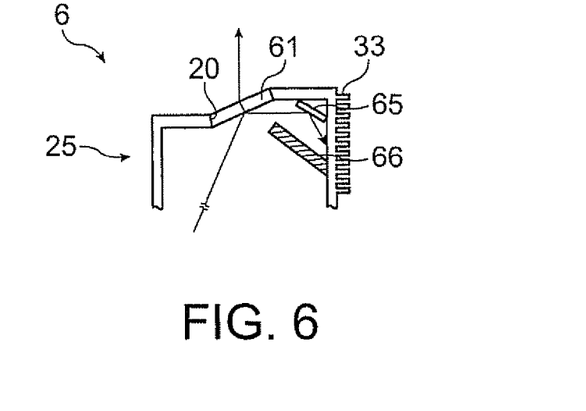
FIG. 6 illustrates a light source according to a modified example of the fifth embodiment of the invention.

FIG. 6 illustrates a modified example of the light source according to the fifth embodiment of the invention. As illustrated in the figure, a light source 6 has a light detector 65 for detecting quantity of infrared light and an aperture 66 for absorbing and reflecting infrared light within the light absorbing member 25. Laser beam entering the wavelength selection mirror 61 enters in a slightly oblique direction from the left, which is a different direction from that of the laser beam in FIG. 5. The angle of the aperture 66 is determined such that the infrared light reflected by the inner wall of the housing 19, the aperture 66, and the wavelength selection mirror 61 does not return to the area of the SHG element 13 and the external resonator 14.

According to the light source 6 in this embodiment, infrared light reflected by the components such as the light detector 65 provided within the light absorbing member 25 does not return to the area of the SHG element 13 and the external resonator 14 as discussed above. Thus, in the structure which controls the quantity of the laser beam by using the light detector 65, leakage of infrared light having adverse effect on the peripheral equipment out of the light source 6 can be prevented, and stabilization of temperature control within the LD light source package and the light source output can be achieved.

Sixth Embodiment

Lighting Device

Initially, a general structure of a lighting device according to a sixth embodiment of the invention is described.

Figure 7:
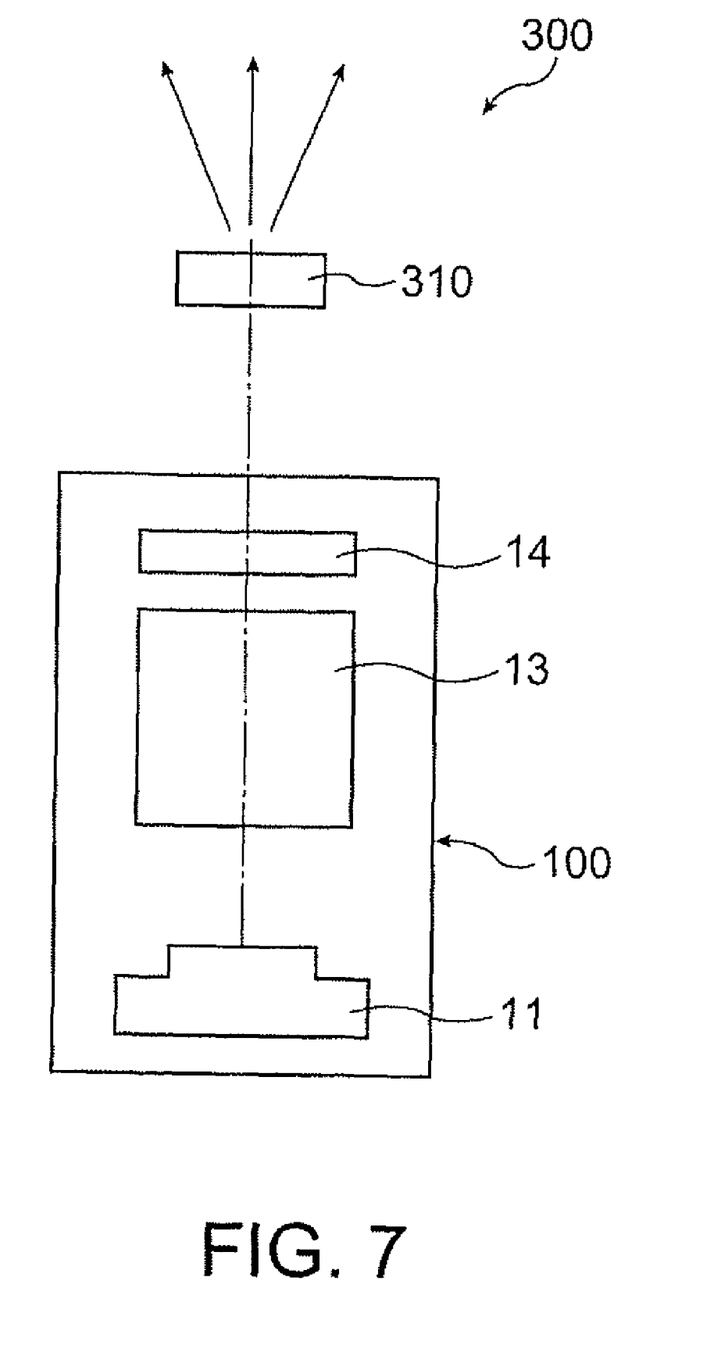
FIG. 7 illustrates a general structure of a lighting device according to a sixth embodiment of the invention.

FIG. 7 illustrates a general structure of a lighting device according to the sixth embodiment of the invention. As illustrated in the figure, a lighting device 300 in this embodiment includes a light source 100, and a diffusing element 310 for diffusing laser beam emitted from the light source 100. The light source 100 is constituted by any of the light sources 1 through 6. The figure shows only the laser beam source 11, the SHG element 13, and the external resonator 14 constituting the light source 100, and not the rest of the constituent elements.

The lighting device 300 having this structure can prevent leakage of infrared light contained in laser beam emitted from the light source 100 with high wavelength conversion efficiency out of the light source 100 via the diffusing element 310. Accordingly, the adverse effect of infrared light on the peripheral equipment of the lighting device 300 is prevented, and stabilization of temperature control within the LD light source package and the light source output is achieved.

Seventh Embodiment

Monitoring Device

A general structure of a monitoring device according to a seventh embodiment of the invention is now described.

Figure 8:
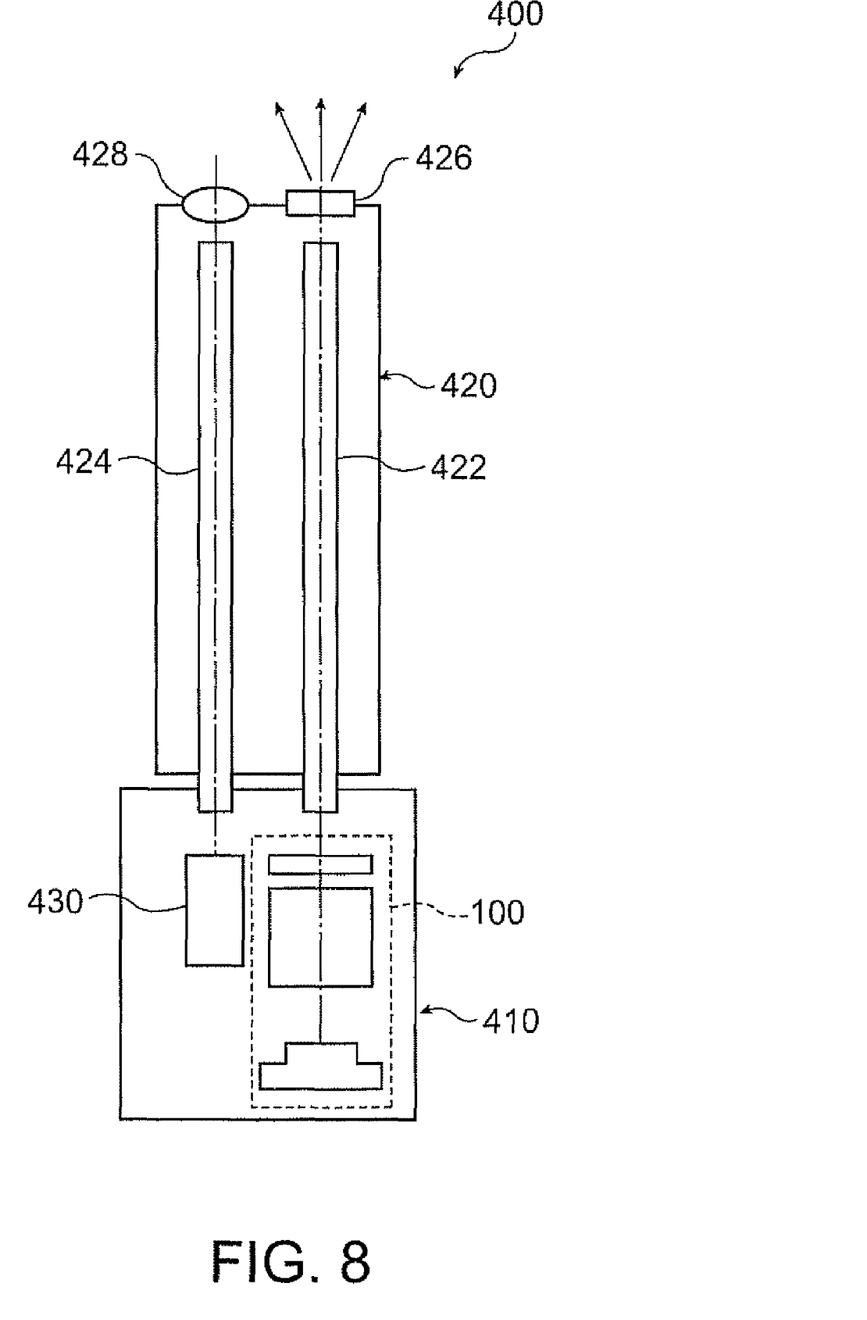
FIG. 8 illustrates a general structure of a monitoring device according to a seventh embodiment of the invention.

FIG. 8 illustrates a general structure of a monitoring device according to the seventh embodiment of the invention. As illustrated in the figure, a monitoring device 400 includes a device main body 410, and a light transmitting unit 420. The device main body 410 has the light source 100 in the sixth embodiment.

The light transmitting unit 420 has two light guides 422 and 424 on the light emitting side and light receiving side. Each of the light guides 422 and 424 is formed by combining a number of optical fibers to supply laser beam to a distant place. The light source 100 is disposed on the light entrance side of the light emitting side light guide 422, and a diffusing plate 426 is provided on the light exit side of the light guide 422. Laser beam emitted from the light source 100 is supplied to the diffusing plate 426 provided at the end of the light transmitting unit 420 through the light guide 422, and the laser beam diffused by the diffusing plate 426 illuminates a subject.

An image forming lens 428 is also provided at the end of the light transmitting unit 420, and reflection light from the subject is received by the image forming lens 428. The received reflection light is transmitted via the receiving side light guide 424 to a camera 430 as an image pickup unit provided within the device main body 410. Thus, an image corresponding to reflection light obtained by illumination of the subject by using laser beam emitted from the light source 100 can be picked up by the camera 430.

According to the monitoring device 400 having this structure, leakage of infrared light contained in laser beam emitted from the light source 100 with high wavelength conversion efficiency out of the light source 100 via the light transmitting unit 420 is prevented. Thus, the adverse effect of infrared light on the peripheral equipment of the monitoring device 400 is prevented, and stabilization of temperature control within the LD light source package and the light source output is achieved.

Eighth Embodiment

Projector

A general structure of a projector according to an eighth embodiment of the invention is now described.

Figure 9:
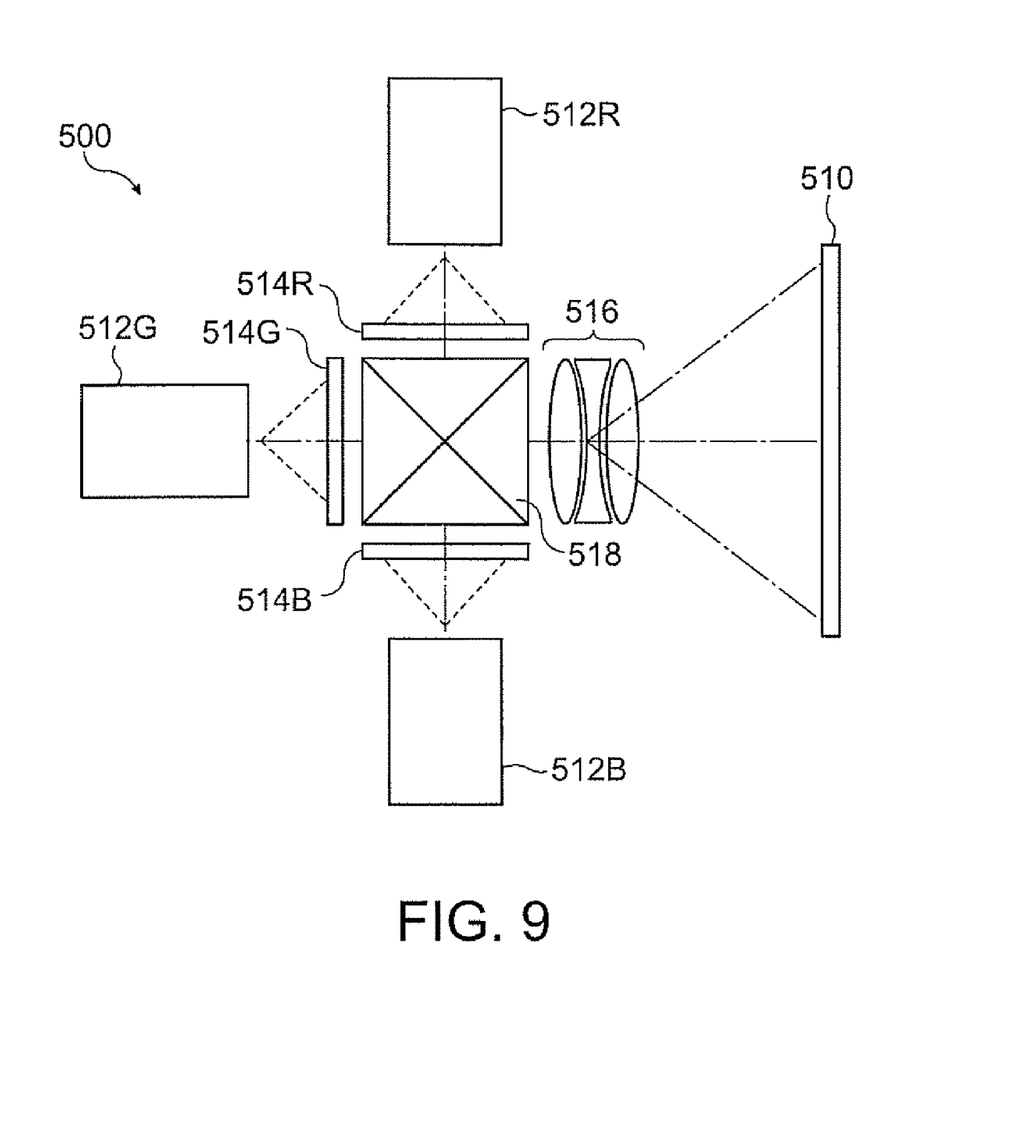
FIG. 9 illustrates a general structure of a projector according to an eighth embodiment of the invention.

FIG. 9 illustrates a general structure of the projector according to the eight embodiment of the invention. In FIG. 9, a housing of a projector 500 is eliminated for simplifying the explanation. The projector 500 is a front projection type projector which supplies light onto a screen 510 for producing reflection light reflected by the screen 510 to be observed as an image.

As illustrated in FIG. 9, the projector 500 includes a red lighting device 512R for emitting red light, a green lighting device 512G for emitting green light, and a blue lighting device 512B for emitting blue light. Each of the red lighting device 512R, the green lighting device 512G, and the blue lighting device 512B has the same structure as that of the lighting device 300 in the sixth embodiment, respectively. Each of the red lighting device 512R, the green lighting device 512G, and the blue lighting device 512B has the SHG element 13 (see FIG. 7). The SHG element 13 provided on the red lighting device 512R converts infrared light into red light by wavelength conversion. The SHG element 13 provided on the green lighting device 512G converts infrared light into green light by wavelength conversion. The SHG element 13 provided on the blue lighting device 512B converts infrared light into blue light by wavelength conversion. It is possible to include components which directly emit laser beams in red, green and blue from the laser beam source instead of using the SHG elements.

The projector 500 includes liquid crystal light valves 514R, 514G, and 5143 which modulate illumination lights emitted from the red lighting device 512R, the green lighting device 512G, and blue lighting device 512B according to image signals received from a personal computer or the like. The projector 500 further includes a cross dichroic prism 518 which combines the lights released from the liquid crystal light valves 514R, 514G, and 514B and guides the combined light to a projection lens 516. The projector 500 further includes the projection lens 516 which enlarges an image formed by the liquid crystal light valves 514R, 514G, and 514B and projects the enlarged image on the screen 510.

The three color lights modulated by the liquid crystal light valves 514R, 514G, and 514B enter the cross dichroic prism 518. This prism is formed by affixing four rectangular prisms, and a dielectric multilayer film for reflecting red light and a dielectric multilayer film for reflecting blue light are disposed in cross shape on the inner surfaces of the prism. These dielectric multilayer films combine the three color lights to produce light representing a color image. The combined light is received by an image forming device, and projected on the screen 510 as a display surface via the projection lens 516 as a projection system such that an enlarged image having desired size can be formed.

The projector 500 having this structure can prevent leakage of infrared light contained in laser beam emitted from the red lighting device 512R, the green lighting device 512G, and the blue lighting device 512B with high wavelength conversion efficiency out of the projection lens 516. Thus, the adverse effect of infrared light on the peripheral equipment of the projector 500 is prevented, and stabilization of temperature control within the LD light source package and the light source output is achieved While the projector 500 in this embodiment is a so-called triple plate type liquid crystal projector, the projector may be a single plate type liquid crystal projector capable of displaying color images by using only one light valve which receives each of color lights from a laser beam source by time division system.

Also, the projector may be of a type having a scanning unit corresponding to an image forming device which displays an image having desired size on a display surface by laser beam scan given onto a screen from a laser beam source containing any one of the light sources 1 through 6. Furthermore, the projector may be a so-called rear projector which supplies light to one surface of a screen to produce light emitted to the other surface of the screen to be observed as an image. The spatial light modulation device is not limited to the transmission type liquid crystal display device, but may be a reflection type liquid crystal display device (liquid crystal on silicon; LCOS), digital mirror device, GLV (grating light valve), or the like.

The invention is not limited to the embodiments described herein, but may be practiced otherwise without departing from the scope of the invention.

The entire disclosure of Japanese Patent Application Nos. 2007-108979, filed Apr. 18, 2007 and 2008-014563, filed Jan. 25, 2008 are expressly incorporated by reference herein.

What is claimed is:

1. A light source comprising:
    a light source unit which supplies first wavelength light;
    a wavelength converting unit which converts the first wavelength light into second wavelength light different from the first wavelength light; and
    a leakage preventing unit which prevents leakage of the first wavelength light out of the light source, the leakage preventing unit including an optical element for specularly reflecting the first wavelength light, wherein the leakage preventing unit has a wavelength separating member which reflects the second wavelength light and transmits the first wavelength light, and a light absorbing member which absorbs substantially all of the first wavelength light having passed through the wavelength separating member so that the first wavelength light does not return to an area where the light source unit and the wavelength converting unit are disposed.

2. The light source according to claim 1, wherein the light absorbing member has a tapered surface whose diameter decreases toward the wavelength separating member, and a light blocking section which blocks the first wavelength light reflected by the tapered surface such that the first wavelength light does not enter the wavelength separating member.

3. The light source according to claim 1, wherein the light absorbing member has a tapered surface whose diameter increases toward the wavelength separating member.

4. The light source according to claim 1, wherein the light absorbing member has a radiating section.

5. The light source according to claim 1, wherein the light absorbing member has a cooling section.

6. The light source according to claim 1, wherein the first wavelength light released from the wavelength converting unit and reflected by the leakage preventing unit does not directly enter the area where the wavelength converting unit is disposed.

7. The light source according to claim 1, further comprising:
    a housing which covers the light source unit, the wavelength converting unit, and the leakage preventing unit, and has an opening through which the second wavelength light is emitted; and
    a window provided on the opening,
    wherein the leakage preventing unit is disposed such that the first wavelength light released from the leakage preventing unit and reflected by the window does not directly enter the area where the wavelength converting unit is disposed.

8. A lighting device comprising the light source according to claim 1.

9. A monitoring device comprising:
    the light source according to claim 1; and
    an image pickup unit which picks up an image of a subject receiving light from the light source.

10. A projector, comprising:
    the light source according to claim 1; and
    an image forming device which displays an image having a desired size on a display surface by using light emitted from the light source.

11. The light source according to claim 1, wherein the light absorbing member has a light diffusing section for diffusing the first wavelength light having passed through the wavelength separating member.

12. The light source according to claim 11, wherein a surface of the light diffusing section through which the first wavelength light enters is inclined to an optical axis of the entering first wavelength light.

13. The light source according to claim 1, wherein:
    the leakage preventing unit has a wavelength separating member which transmits the second wavelength light and reflects the first wavelength light, and a light absorbing member which absorbs the first wavelength light reflected by the wavelength separating member; and
    the light absorbing member has a light blocking section which blocks the reflected first wavelength light such that the first wavelength light does not enter the area where the wavelength converting unit is disposed.

14. The light source according to claim 13, wherein:
    the light absorbing member has a light detecting section which detects a quantity of the reflected first wavelength light; and
    the light blocking section blocks the first wavelength light which contains light reflected by the light detecting section such that the first wavelength light does not enter the area where the wavelength converting unit is disposed.

* * * * *